United States Patent
Hou

[11] Patent Number: 5,946,803
[45] Date of Patent: Sep. 7, 1999

[54] METHOD FOR MAKING HEAT SINK HAVING ULTRA-THIN FINS

[75] Inventor: Kai Hou, Chino Hill, Calif.

[73] Assignee: Hon Hai Precision Ind. Co., Ltd., Taipei Hsien, Taiwan

[21] Appl. No.: 09/002,253

[22] Filed: Dec. 31, 1997

[51] Int. Cl.⁶ .................................................. B23P 15/26
[52] U.S. Cl. ........................................ 29/890.03; 29/424
[58] Field of Search ........................... 29/890.03, 557, 29/559, 423, 424

[56] References Cited

U.S. PATENT DOCUMENTS

| | | | |
|---|---|---|---|
| 5,533,257 | 7/1996 | Romero et al. | 29/890.03 |
| 5,572,789 | 11/1996 | Fisher et al. | 29/890.03 |
| 5,791,045 | 8/1998 | Yamamoto et al. | 29/890.03 |
| 5,791,406 | 8/1998 | Gonner et al. | 29/890.03 |

*Primary Examiner*—I Cuda

[57] ABSTRACT

A method for making a ultra-thin fin heat sink includes the following steps. First, a continuous elongated heat sink bar is made by, the extrusion procedure wherein such heat sink bar is formed with a plurality of parallel closely spaced ultra-thin fins integrally extending from a base. Liquid type wax is injected into the space between every two adjacent fins until such space is completely filled with the wax. The wax is solidified after a while, and then the whole assembly including the heat sink bar with the inner wax generally becomes a whole solid reinforced structure which can bear the traditional sawing procedure. Via a fixture, the assembly is sawed/cut to pieces of the predetermined length. The cut pieces are successively heated to have the inner solid wax liquefied and leave from the heat sink unit.

9 Claims, 2 Drawing Sheets

METHOD FOR MAKING HEAT SINK HAVING ULTRA-THIN FINS

BACKGROUND OF THE INVENTION

1. Field of the Invention

The invention relates to a method for making a heat sink for use with a CPU, and particularly to a heat sink having ultra-thin fins.

2. The Related Art

Heat sinks for use with CPUs in computer systems have recently become popular, and higher demands have been placed on the heat sinks due to increased signal transmission speed and capacity of the corresponding CPUs. Other than folded-fin type heat sinks as shown in U.S. Pat. Nos. 5,375,655 and 5,625,229, and implanted fin type heat sinks as shown in U.S. Pat. Nos. 5,038,858 and 5,509,465, traditional heat sinks are generally of the integral extrusion type as shown in U.S. Pat. Nos. 5,592,363 and 5,594,623 wherein the extrusion type can be further modified from a multiple-fin type, by additional milling, to a multiple-pin type as shown in U.S. Pat. No. 5,602,719. As speed of signal transmission of the CPU increases, so does the heat generated thereby. Therefore, it is necessary to increase the heat transfer efficiency of the heat sink. Heat transfer efficiency is commonly increased by reducing the thickness of the fins and increasing the density thereof, thereby increasing the total heat transfer surface area.

Unfortunately, due to manufacturing limitations, only a few manufacturers can fabricate an extrusion heat sink having fins with a thickness of 0.03" (i.e., minimum dimension). Even though the minimum thickness of fins of the heat sink can be obtained, a problem remains in mass production thereof. Extrusion is a method for making a continuous elongate part which is cut to a predetermined length. However, the 0.03" thickness of the fins is too fragile to endure the impact, vibration and force of the cutting process resulting in a high defect ratio and significantly increasing manufacturing costs. An EDM (electro-discharge machining) procedure has been introduced to gently cut the elongate parts to the desired length. However, such a procedure is time and cost inefficient.

Therefore, an object of the invention is to provide a time and cost efficient method for fabricating an ultra-thin fin heat sink.

SUMMARY OF THE INVENTION

According to an aspect of the invention, a method for making a heat sink having ultra-thin fins includes the following steps. A continuous elongate heat sink bar made by extrusion is formed with a plurality of closely spaced, parallel, ultra-thin fins integrally extending from a base. Liquid wax is injected into the space between adjacent fins. The entire assembly including the heat sink bar becomes a solid reinforced structure which can withstand a traditional cutting procedure. The fins are cut to a predetermined length. The assembly is then heated whereby the wax liquefies and is removed from the heat sink unit.

DETAILED DESCRIPTION OF THE PREFERRED EMBODIMENTS

Figure 1:
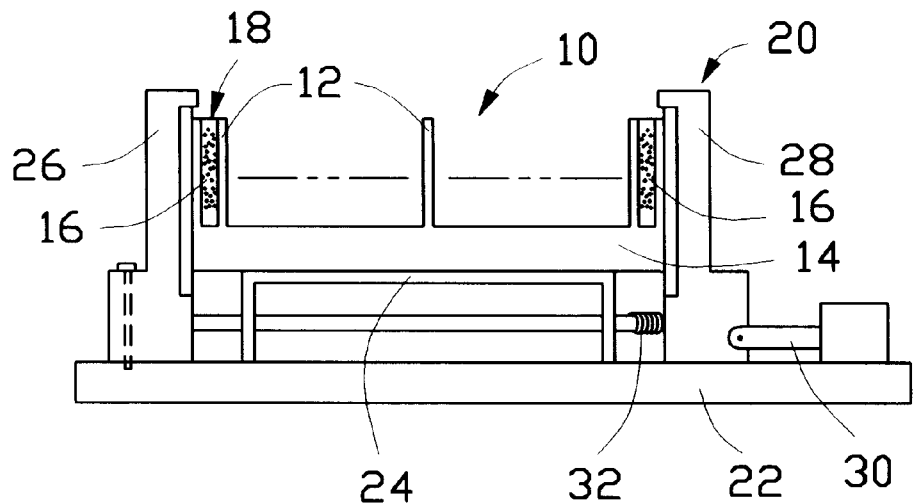
FIG. 1 is a side view of a preferred embodiment of an apparatus for use with a method for making a heat sink unit having ultra-thin fins, in accordance with the present invention.

References will now be in detail to the preferred embodiments of the invention. It will be noted here that for better understanding, most of like components are designated by like reference numerals throughout the various figures in the embodiments.

Figure 2:
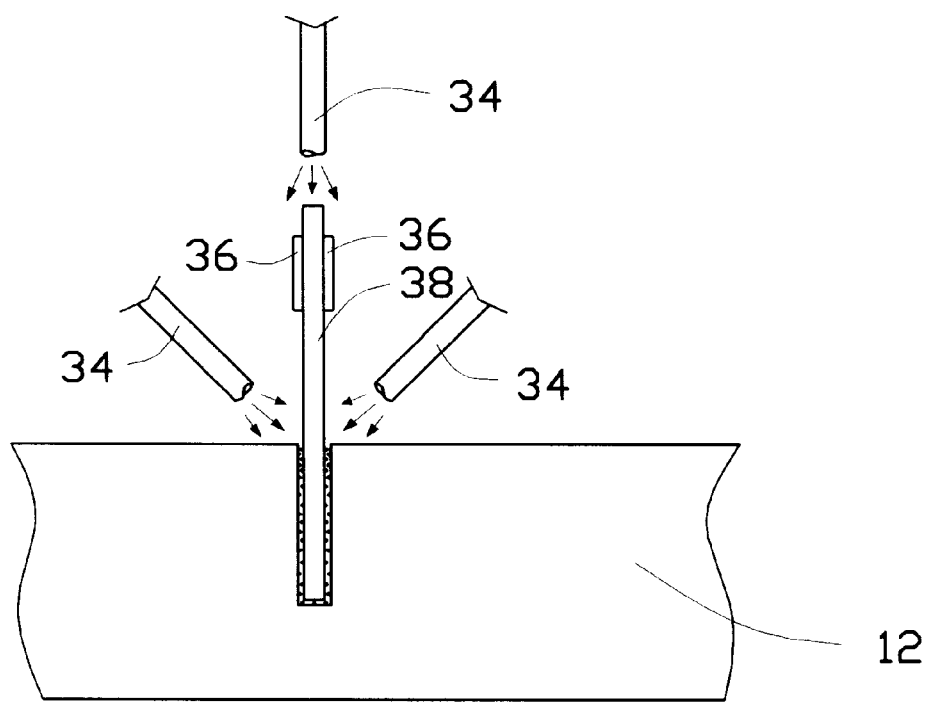
FIG. 2 is a partial front view of a tool and related equipment for use in the method of the present invention.

Attention is directed to FIGS. 1 and 2, wherein the method for making the ultra-thin fin heat sink having a 0.03" thickness of the fin includes the following steps.

A continuous elongate heat sink bar 10 is made by an extrusion procedure wherein the heat sink bar 10 includes a plurality of high density ultra-thin (e.g., 0.03" thickness) parallel fins 12 vertically extending integrally from a base 14. Liquid wax 16 is injected into the space between adjacent fins 12 until the space is completely filled. After the wax 16 solidifies at or below room temperature, the entire assembly 18 including the heat sink bar 10 and the wax 16 becomes a reinforced structure which can endure a traditional cutting procedure.

The assembly 18 is held in position by means of a fixture assembly 20 including a working plate 22, a support table 24, a fixed claw 26 disposed at one end of the table 24, and a slidable claw 28 disposed at another end thereof and operated by a compact piston 30 with a corresponding spring 32. A pair of rubber gaskets (not shown) are provided between opposite sides of the heat sink bar 10 and the corresponding claws 26, 28, respectively, for damping vibration during the cutting process and producing constant contact on both sides of the heat sink bar 10.

A chilled coolant 34 is sprayed on the area of contact between the heat sink bar 10 and a saw 38. Thus, the saw 38 with an associated support 36 on opposite sides thereof can firmly, stably and efficiently cut the heat sink bar 10 to a predetermined length. The heat sink bar 10 is then heated to melt and remove the solid wax 16 thereby producing a heat sink unit of desired length.

The main feature of the invention is to provide solid support between adjacent fins for reinforcing the structure thereof to resist the impact of the cutting procedure. Another main feature of the invention is to use wax to implement such reinforcement. Thus, several issues have been addressed herein.

(1) The chilled coolant 34 not only lubricates the saw and eases cutting, but it also cools the wax thereby inhibiting melting thereof.

(2) The wax makes the heat sink bar behave like a solid body to withstand the cutting procedure.

(3) Wax also lubricates the saw blade for facilitating cutting.

(4) Wax can compactly and completely fill the space between adjacent fins with better results than a conventional jig or support.

(5) The saw cutting procedure can be conducted using several saw blades simultaneously. Thus, one saw cutting operation can produce several heat sink units of predetermined length.

(6) The wax used in this application can be recycled, thus, there is no waste.

(7) The present method of cutting the elongate heat sink bar having a high density of ultra-thin fins significantly reduces manufacturing time and cost.

(8) The present method can also be applied to folded type heat sinks.

(9) The present method can also be applied to a milling process for forming pin type heat sinks.

Figure 3:
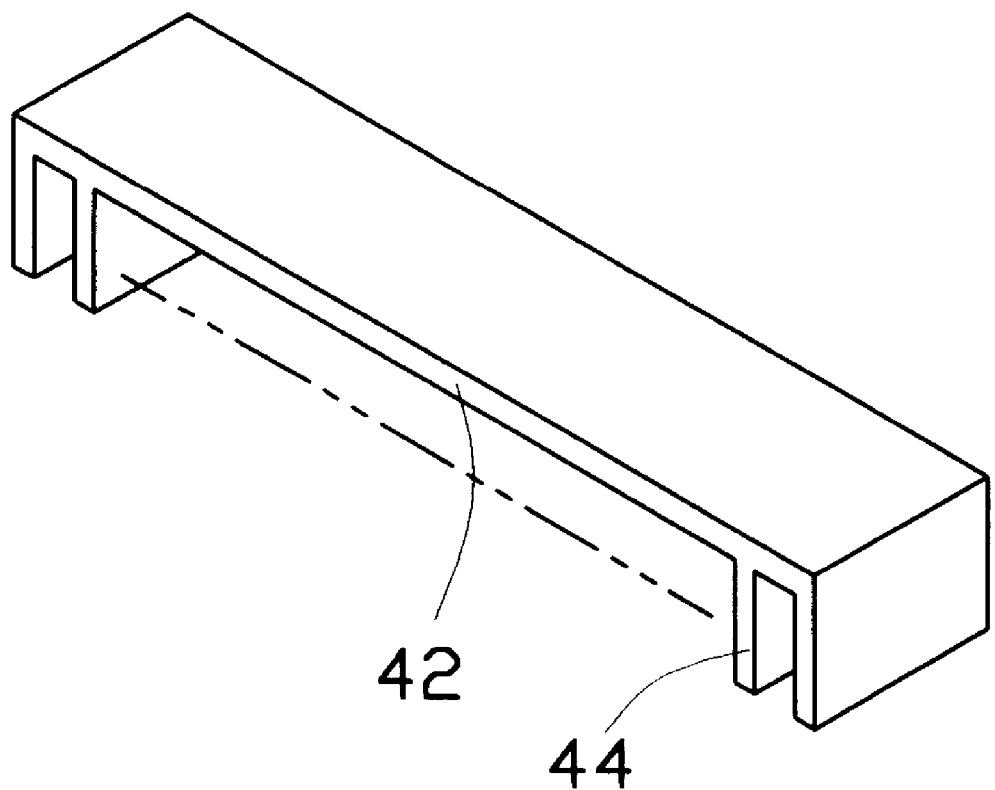
FIG. 3 is a perspective view of a jig-like device for use in the second embodiment of the method of the invention.

FIG. 3 shows another embodiment of the invention wherein a jig assembly 40 is provided for cooperation with the saw cutting process. The jig assembly 40 includes a body 42 with a plurality of spaced parallel partitions 44 extending downwardly therefrom wherein the thickness of each partition 44 is generally equal to the width of the corresponding space between adjacent fins 12 and the height of the partition 44 is generally equal to the depth of such space. Therefore, the jig assembly 40 can be placed around the cutting region with the partitions 44 received within the corresponding spaces so as to reinforce the fins and facilitate a cutting procedure applied thereto.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims.

Therefore, persons of ordinary skill in this field are to understand that all such equivalent structures are to be included within the scope of the following claims.

We claim:

1. A method for making a heat sink unit including the following steps:

forming an elongate heat sink bar with a base and a plurality of fins extending therefrom;

filling spaces defined between adjacent fins with liquid wax;

solidifying said wax to reinforce the fins of the heat sink bar;

providing a fixture assembly to hold the heat sink bar in position;

cutting the heat sink bar to a predetermined length; and liquefying the wax and removing said wax from the heat sink bar to obtain the final heat sink unit.

2. The method as defined in claim 1, wherein said fixture assembly includes a fixed claw and a slidable claw for releasably holding the heat sink bar in position.

3. The method as defined in claim 1, wherein chilled coolant is provided during cutting.

4. The method as defined in claim 1, wherein the heat sink bar is formed by extrusion.

5. A method for making a heat sink unit including the following steps:

forming an elongate heat sink bar with a base and a plurality of closely spaced parallel fins;

providing means for occupying spaces between adjacent fins for supplying reinforcement thereto;

cutting the heat sink bar around said means; and removing said means from the heat sink bar.

6. The method as defined in claim 5, wherein said means is wax which is injected into said spaces in a liquid state and transforms to a solid state.

7. The method as defined in claim 6, wherein the step of removing said means is accomplished by liquefying the solid wax.

8. The method as defined in claim 5, wherein said means is a jig assembly including a body with a plurality of spaced parallel partitions extending therefrom.

9. The method as defined in claim 8, wherein a thickness of each partition of said jig assembly is generally equal to the width of the corresponding space of the heat sink bar, and a height of the partition of said jig assembly is generally equal to a depth of said space.

* * * * *